(12) United States Patent
Murakami et al.

(10) Patent No.: US 6,841,879 B2
(45) Date of Patent: Jan. 11, 2005

(54) SEMICONDUCTOR DEVICE

(75) Inventors: Takaaki Murakami, Hyogo (JP); Kazuyuki Sugahara, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 568 days.

(21) Appl. No.: 09/970,771

(22) Filed: Oct. 5, 2001

(65) Prior Publication Data
US 2002/0171113 A1 Nov. 21, 2002

(30) Foreign Application Priority Data
May 15, 2001 (JP) ........................................ 2001-144431

(51) Int. Cl.$^7$ .............................................. H01L 23/48
(52) U.S. Cl. ............................ 257/754; 25/755; 25/757; 25/768
(58) Field of Search ............................ 257/754, 755, 257/757, 768

(56) References Cited

U.S. PATENT DOCUMENTS 5,719,083 A * 2/1998 Komatsu ................... 438/652
6,100,562 A * 8/2000 Yamazaki et al. .......... 257/347
6,365,471 B1 * 4/2002 Chen et al. ................. 438/301

OTHER PUBLICATIONS

E. Morifuji et al.; "RF modeling for 0.1$\mu$m gate length MOSFETS", *Proc. 29$^{th}$ ESSDERC*, pp. 656–659, 1999.

Yutaka Hoshino et al.; "High performance Scaled down Si LDMOSFET with Thin Gate Bird's beak Technology for RF power Amplifiers", *IEDM Tech. Digest*, pp. 205–208, 1999.

* cited by examiner

*Primary Examiner*—Jasmine Clark
(74) *Attorney, Agent, or Firm*—Leydig, Voit & Mayer, Ltd.

(57) ABSTRACT

A field-effect transistor including N$^-$-extension regions, an N$^+$-drain region, an N$^+$-source region and a gate electrode at a surface of a silicon substrate. A sidewall insulating film on one of the side surfaces of the gate electrode partially covers the surface of the N$^-$-extension region, and a sidewall insulating film on the other side surface entirely covers the N$^-$-extension region. Further, a silicon oxide film covers the surface of N$^-$-extension region not covered by the sidewall insulating film. Thereby, resistances of the gate electrode, source region, and drain region can be easily reduced in a transistor having extension regions, which are asymmetrical with respect to the gate electrode.

7 Claims, 7 Drawing Sheets

SEMICONDUCTOR DEVICE

BACKGROUND OF THE INVENTION

1. Field of the Invention

The present invention relates to a semiconductor device and a method of manufacturing the device, and particularly relates to a semiconductor device having an extension region, which is asymmetrical with respect to a gate electrode, as well as a method of manufacturing the device.

2. Description of the Background Art

A conventional transistor, which is used in a high-frequency power amplifier, will now be described. As shown in FIG. 17, a p-type epitaxial layer 110 is formed on a silicon substrate 101. A p-type diffusion region 109 is located at p-type epitaxial layer 110. An $N^-$-extension region 103, an $N^+$-drain region 102 and an $N^+$-source region 104 are located at p-type epitaxial layer 110.

A gate electrode 106 including a polycrystalline silicon film 106b and a tungsten silicide film 106a is located on a p-type diffusion region 109, which is located between $N^-$-extension region 103 and $N^+$-source region 104, with a gate insulating film 105 therebetween.

An interlayer insulating film 108 covering gate electrode 106 is located on silicon substrate 101. Interlayer insulating film 108 is provided with a contact hole 108a exposing the surface of gate electrode 106. Contact hole 108a is filled with, e.g., a plug 111. An aluminum interconnection 112 is located on interlayer insulating film 108, and is electrically connected to plug 111.

Description will now be given on major steps in a method of manufacturing the semiconductor device described above. As shown in FIG. 18, p-type epitaxial layer 110 is formed on silicon substrate 101. Using predetermined resist (not shown) as a mask, p-type ions are implanted into p-type epitaxial layer 110 to form p-type diffusion region 109. Then, gate electrode 106 is formed on p-type epitaxial layer 110 with gate insulating film 105 therebetween. Using gate electrode 106 as a mask, n-type ions are implanted into p-type epitaxial layer 110 to form $N^-$-extension region 103 and others.

Then, as shown in FIG. 19, resist 113 is formed over a portion of the top surface of gate electrode 106 and a portion of the surface of $N^-$-extension region 103 for continuously covering these portions. Using resist 113 as a mask, n-type ions are implanted into p-type epitaxial layer 110 to form $N^+$-drain region 102 and $N^+$-source region 104. Thereafter, resist 113 is removed. In this manner, major portions of the transistor having gate electrode 106, $N^+$-source region 104 and $N^+$-drain region 102 is completed in the semiconductor device.

Particularly, the transistor used in the high-frequency power amplifier is configured to ensure a high breakdown voltage (drain breakdown voltage) between $N^+$-drain region 102 and silicon substrate 101 surrounding the same, and for this purpose, $N^+$-drain region 102 and others are formed such that $N^-$-extension region 103 located between $N^+$-drain region 102 and gate electrode 106 may be longer than the $N^-$-extension region (see FIG. 18) located between gate electrode 106 and $N^+$-source region 104. Thus, the transistor employs a structure, in which $N^-$-extension region 103 is asymmetrical with respect to gate electrode 106.

However, the semiconductor device described above suffers from the following problem. A salicide process has been generally known as a process for reducing resistances of gate electrode 106, $N^+$-source region 104 and $N^+$-drain region 102 in the transistor. In the salicide process, metal silicide layers are formed in a self-aligned fashion at these regions.

In the transistor of the semiconductor device described above, however, a sidewall insulating film is not formed on a side surface of gate electrode 106, as shown in FIG. 17. Therefore, $N^-$-extension region 103, $N^+$-drain region 102, $N^+$-source region 104 and gate electrode 106 are electrically connected when a predetermined metal film is formed for silicidation after the step shown in FIG. 19. Therefore, it is impossible to form the silicide layer by the salicide process.

During the salicide process, impurities in $N^-$-extension region 103 are absorbed into the silicide layer so that the impurity concentration in $N^-$-extension region 103 lowers, and thus, the breakdown voltage lowers.

Such a problem also arises that the metal silicide entering the silicon changes the structure of the transistor.

SUMMARY OF THE INVENTION

The invention has been developed for overcoming the above problems, and it is an object of the invention to provide a semiconductor device allowing easy reduction of resistances of a gate electrode, a source region and a drain region in a transistor, in which an extension region is symmetrical with respect to the gate electrode. Another object of the invention is to provide a method of manufacturing such a semiconductor device.

According to an aspect of the invention, a semiconductor device includes a semiconductor substrate having a main surface, an electrode, a first impurity region of a predetermined conductivity type, a second impurity region of the predetermined conductivity type, a third impurity region of the predetermined conductivity type, a fourth impurity region of the predetermined conductivity type and a metal silicide layer. The electrode is formed on the semiconductor substrate with an insulating film therebetween, and has opposite side surfaces and a top surface. The first impurity region of the predetermined conductivity type is formed at the surface of the semiconductor substrate, extends substantially from a position immediately under one of the opposite side surfaces of the electrode away from the electrode and has a first length on the surface of the semiconductor substrate. The second impurity region of the predetermined conductivity type is formed at the surface of the semiconductor substrate, extends substantially from a position immediately under the other side surface of the electrode away from the electrode and has a second length on the surface of the semiconductor substrate shorter than the first length. The third impurity region of the predetermined conductivity type is formed at the surface of the semiconductor substrate, extends from a position neighboring to the first impurity region away from the electrode and has a higher impurity concentration than the first impurity region. The fourth impurity region of the predetermined conductivity type is formed at the surface of the semiconductor substrate, extends from a position neighboring to the second impurity region away from the electrode and has a higher impurity concentration than the second impurity region. The metal silicide layer is formed at least at a portion of the top surface of the electrode and the surfaces of the third and fourth impurity regions.

According to the above structure, the field-effect transistor having the electrode and the first to fourth impurity regions is configured such that the first impurity region has a longer length on the surface of the semiconductor substrate than the second impurity region, and the first and second impurity regions are asymmetrical with respect to the electrode. In this field-effect transistor, the metal silicide layer is formed at least at a portion of the top surface of the electrode. Therefore, the resistance of the electrode can be reduced. Since the metal silicide layers are also formed on the surfaces of the third and fourth impurity regions, respectively, the resistances of these impurity regions can be reduced, and high-frequency characteristics can be improved.

Preferably, for forming the metal silicide described above, the semiconductor device further includes a protection film covering a portion of the top surface of the electrode and the surfaces of the first and second impurity regions for preventing silicidation of the portion of the top surface of the electrode and the surfaces of the first and second impurity regions.

Thereby, such a situation can be preventing that the impurities in the first impurity region are taken into the metal silicide layer to reduce the impurity concentration when forming the metal silicide layer. Therefore, the breakdown voltage (drain breakdown voltage) of the transistor does not lower.

The above protection film preferably includes a one-side sidewall insulating film formed on one of the opposite side surfaces of the electrode and covering a portion of the surface of the first impurity region, a covering film continuously covering at least a portion of the surface of the one-side sidewall insulating film and the surface of the first impurity region not covered with the one-side sidewall insulating film, and an other-side sidewall insulating film formed on the other side surface of the electrode and covering the whole surface of the second impurity region.

Thereby, the surfaces of the first and second impurity regions can be reliably covered, and can be prevented from silicidation.

The covering film preferably has etching characteristics different from etching characteristics of the one-side and other-side sidewall insulating films.

Thereby, the covering film can be easily formed, and can be easily peeled off after forming the one-side and other-side sidewall insulating films, while effecting substantially no etching on the one-side and other-side sidewall insulating films.

In the process of forming the protection film, the protection film may be shifted in the direction of the width of the gate electrode if an overlaying precision of a photolithography mask is insufficient. If the amount of shift of the protection film depending on the mask overlaying precision is smaller than a width of the electrode, the protection film may be formed to locate the end of the protection film near the electrode substantially at or around a center of the electrode. Thereby, a portion not covered with the protection film can be formed in the top surface of the electrode so that the metal silicide layer can be formed at a portion of the top surface of the electrode.

If the amount of shift of the protection film depending on the mask overlaying precision is smaller than a width of the side wall insulating film, it is not necessary to cover the portion of the top surface of the electrode with the protection film, and the metal silicide layer can be formed entirely over the top surface of the electrode.

Thereby, the resistance of the electrode can be further reduced, and the high-frequency characteristics of the field-effect transistor can be further improved.

Preferably, for forming the above metal silicide layer, the semiconductor device includes a protection film including a one-side covering film formed in contact with one of the opposite side surfaces of the electrode, and covering the whole surface of the first impurity region, and an other-side covering film formed in contact with the other side surface of the electrode, and covering the whole surface of the second impurity region.

Thereby, in the process of forming the metal silicide layer, silicidation of the whole top surface of the electrode is performed, and such a situation does not occur that the impurities in the first impurity region are taken into the metal silicide layer to lower the impurity concentration. Therefore, the breakdown voltage (drain breakdown voltage) of the transistor does not lower.

A method of manufacturing a semiconductor device of another aspect of the invention includes the following steps. An electrode having opposite side surfaces and a top surface is formed on a semiconductor substrate with a first insulating film therebetween. A first impurity region of a predetermined conductivity type extending substantially from a position immediately under one of the opposite side surfaces of the electrodes away from the electrode is formed at the surface of the semiconductor substrate, and a second impurity region of the predetermined conductivity type extending substantially from a position immediately under the other side surface of the electrode away from the electrode is formed at the surface of the semiconductor substrate. A third impurity region of the predetermined conductivity type having a higher impurity concentration than the first impurity region, being in contact with the first impurity region and spaced by a first length on the surface of the semiconductor substrate substantially from a position immediately under one of the opposite side surfaces is formed at the surface of the semiconductor substrate, and a fourth impurity region of the predetermined conductivity type having a higher impurity concentration than the second impurity region, being in contact with the second impurity region and spaced by a second length shorter than the first length on the surface of the semiconductor substrate substantially from a position immediately under the other side surface of the electrode is formed at the surface of the semiconductor substrate. A metal silicide layer is formed at each of the surfaces of the third and fourth impurity regions and the top surface of the electrode. After forming the first and second impurity regions, and before forming the metal silicide layer, processing is performed to form a protection film covering at least the surfaces of the first and second impurity regions for preventing silicidation of the first and second impurity regions when forming the metal silicide layer at each of the surfaces of the first and second impurity regions.

This method of manufacturing the semiconductor device can provide a field-effect transistor having the electrode and the first to fourth impurity regions. At the surface of the semiconductor substrate, the first impurity region is longer than the second impurity region, and the first and second impurity regions are asymmetrical with respect to the electrode. A predetermined protection film is formed for the field-effect transistor, whereby silicidation of the surfaces of the first and second impurity regions can be easily prevented, and the metal silicide layers can be formed at the surfaces of the third impurity region, the fourth impurity region and the electrode.

The step of forming the protection film preferably includes the steps of forming a one-side sidewall insulating film covering a portion of the surface of the first impurity region on one of the opposite side surfaces of the electrode; forming a covering film continuously covering at least a portion of the surface of the one-side sidewall insulating film and the surface of the first impurity region not covered with the one-side sidewall insulating film; and forming an other-side sidewall insulating film covering the whole surface of the second impurity region on the other side surface of the electrode.

In this case, the protection film can be formed relatively easily.

The step of forming the one-side and other-side sidewall insulating films preferably includes the steps of forming a second insulating film covering the electrode on the semiconductor substrate after forming the electrode, and effecting anisotropic etching on the second insulating film, and the step of forming the covering film preferably includes the step of forming a third insulating film having etching characteristics different from those of the second insulating film.

In this case, the third insulating film can be formed substantially without effecting etching on the second insulating film.

The step of forming the covering film is preferably performed to extend continuously the covering film further from the position on the surface of the one-side sidewall insulating film to the position substantially at the center of the top surface of the electrode.

In this case, the protection film may be shifted in the direction of the width of the gate electrode if an overlaying precision of a photolithography mask used for forming the protection film is insufficient. If the amount of shift of the protection film depending on the mask overlaying precision is smaller than a width of the electrode, the protection film may be formed to locate the end of the protection film near the electrode substantially at or around a center of the electrode. Thereby, the metal silicide layer can be reliably formed at a portion of the top surface of the electrode.

The step of forming the protection film preferably includes the steps of forming a one-side covering film being in contact with one of the opposite side surfaces of the electrode, and covering the whole surface of the first impurity region; and forming an other-side covering film being in contact with the other side surface of the electrode, and covering the whole surface of the second impurity region.

In this case, the surfaces of the first and second impurity regions can be reliably covered, and can be prevented from silicidation.

More specifically, the step of forming the one-side and other-side covering films preferably includes the steps of forming a fourth insulating film covering the electrode on the semiconductor substrate after forming the electrode, effecting processing on the fourth insulating film to expose and locate the top surface of the electrode to be substantially flush with the top surface of the fourth insulating film, removing the fourth insulating film located from a region other than a predetermined region; and the step of forming the third and fourth impurity regions includes the step of implanting impurities of the predetermined conductivity type using the one-side covering film, the other-side covering film and the electrode as a mask.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
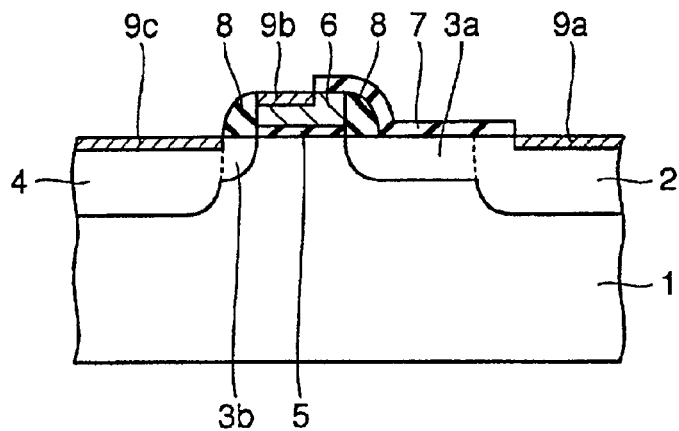
FIG. 1 is a cross section of a semiconductor device according to a first embodiment of the invention.

A semiconductor device according to a first embodiment of the invention and a method of manufacturing the same will now be described. As shown in FIG. 1, a gate electrode 6 is formed on a silicon substrate 1 with a gate insulating film 5 therebetween. Sidewall insulating films 8 are formed on the opposite side surfaces of gate electrode 6.

An $N^-$-extension region 3a and an $N^+$-drain region 2 are formed at one of regions of silicon substrate 1 located on the opposite sides of gate electrode 6, and an $N^-$-extension region 3b and an $N^+$-source region 4 are formed on the other region of silicon substrate 1.

A metal silicide layer 9 is formed at a portion of the top surface of gate electrode 6. A metal silicide layer 9a is formed at the surface of $N^+$-drain region 2. A metal silicide layer 9c is formed at the surface of $N^+$-source region 4.

A silicon oxide film 7 covers a portion of gate electrode 6, which is located between metal silicide layers 9b and 9a, sidewall insulating film 8, $N^-$-extension region 3a and a portion of $N^+$-drain region 2. The transistor of the semiconductor device according to the first embodiment has the major structure described above.

In particular, the transistor in this semiconductor device is applied to a radio using a frequency range of 5 GHz or lower, and more specifically, may be applied to a business-grade radio using a frequency range of 150 MHz or 430 MHz, a terminal and a base station for a mobile telephone system using a frequency range of, e.g., 900 MHz, 1.8 GHz or 2 GHz, and a cordless LAN (Local Area Network) using a frequency range of 5 GHz.

Figure 2:
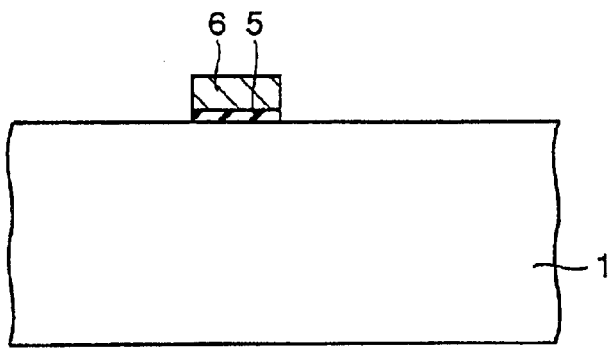
FIG. 2 is a cross section showing a step in a method of manufacturing the semiconductor device of the first embodiment shown in FIG. 1.

Description will now be given on an example of a method of manufacturing the semiconductor device described above. First, a silicon oxide film forming a gate insulating film is formed on silicon substrate 1. For example, a polycrystalline silicon film forming the gate electrode is formed on the silicon oxide film. Predetermined photolithography and treatment are effected on the polycrystalline silicon film to form gate electrode 6 on silicon substrate 1 with gate insulating film 5 therebetween, as shown in FIG. 2.

Figure 3:
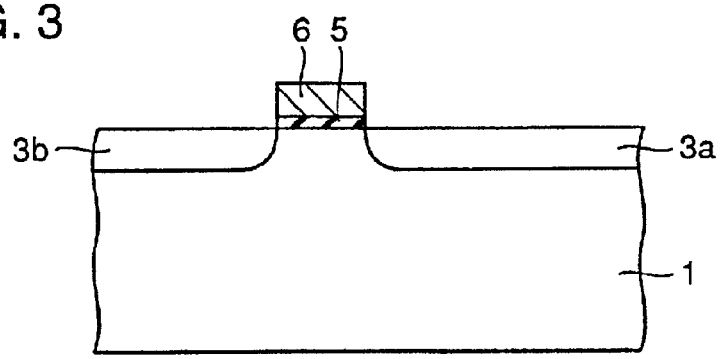
FIG. 3 is a cross section showing a step following the step shown in FIG. 2 in the first embodiment.
Figure 4:
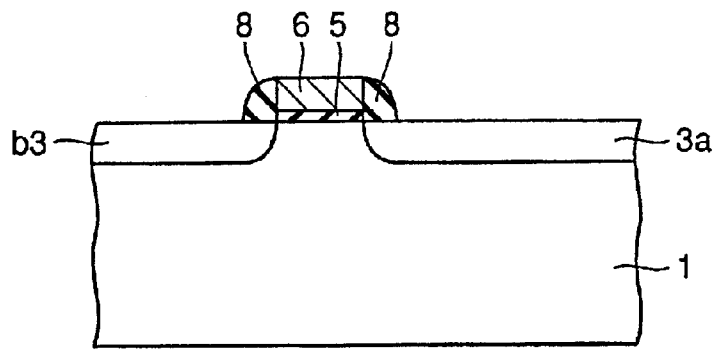
FIG. 4 is a cross section showing a step following the step shown in FIG. 3 in the first embodiment.

Then, as shown in FIG. 3, arsenic or the like is implanted into silicon substrate 1 masked with gate electrode 6 so that $N^-$-extension regions 3a and 3b having impurity concentrations of $1 \times 10^{16}$–$1 \times 10^{17}/cm^3$ are formed. Thereafter, a silicon nitride film or the like covering gate electrode 6 is formed on silicon substrate 1. Anisotropic etching is effected on the silicon nitride film thus formed so that sidewall insulating films 8 are formed on the opposite side surfaces of gate electrode 6, respectively, as shown in FIG. 4.

Figure 5:
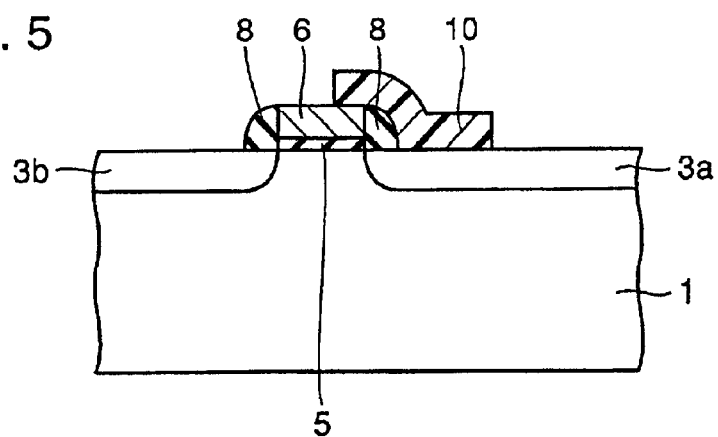
FIG. 5 is a cross section showing a step following the step shown in FIG. 4 in the first embodiment.

Then, as shown in FIG. 5, a resist mask 10 for forming the $N^+$-drain region and $N^+$-source region is formed. Resist mask 10 continuously covers a portion of gate electrode 6, sidewall insulating film 8 and a portion of $N^-$-extension region 3a.

Figure 6:
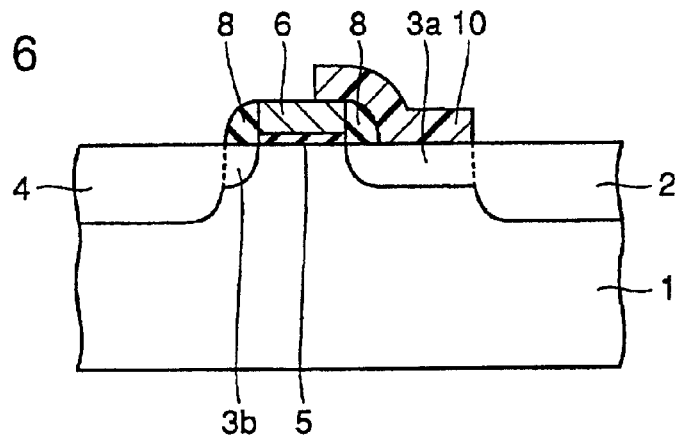
FIG. 6 is a cross section showing a step following the step shown in FIG. 5 in the first embodiment.

As shown in FIG. 6, arsenic or the like is implanted into silicon substrate 1, which is masked with resist mask 10, gate electrode 6 and sidewall insulating film 8, so that $N^+$-drain region 2 and $N^+$-source region 4 having impurity concentrations of about $1 \times 10^{18}$–$1 \times 10^{19}/cm^3$. Thereby, $N^-$-extension regions 3a and 3b are arranged asymmetrically with respect to gate electrode 6.

Figure 7:
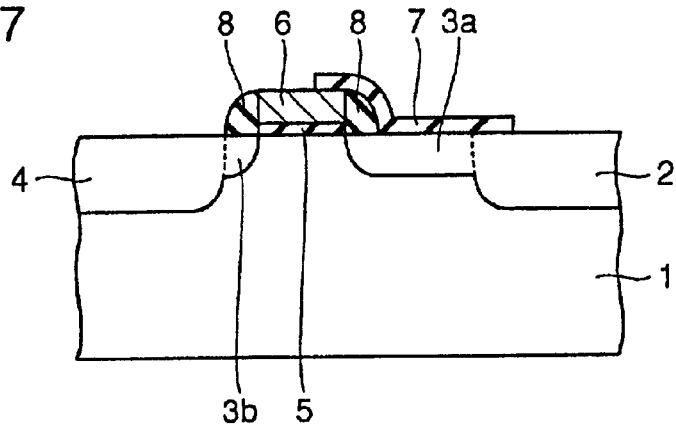
FIG. 7 is a cross section showing a step following the step shown in FIG. 6 in the first embodiment.

After removing resist mask 10, a silicon oxide film covering gate electrode 6 and sidewall insulating film 8 is formed on silicon substrate 1. Predetermined photolithography and treatment are effected on the silicon oxide film thus formed so that silicon oxide film 7 is formed as shown in FIG. 7. Silicon oxide film 7 continuously covers a portion of gate electrode 6, sidewall insulating film 8, $N^-$-extension region 3a and a portion of $N^+$-drain region 2 for particularly preventing silicidation of $N^-$-extension region 3a in a later step.

Figure 8:
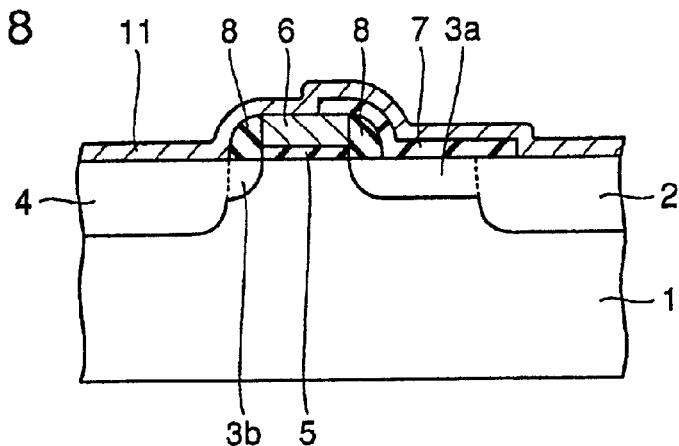
FIG. 8 is a cross section showing a step following the step shown in FIG. 7 in the first embodiment.

Then, as shown in FIG. 8, a film 11 made of metal such as tungsten or cobalt having a high melting point is formed, e.g., by sputtering over silicon oxide film 7, gate electrode 6 and sidewall insulating films 8 as shown in FIG. 8.

Then, heat treatment, e.g., at about 400° C. is effected to cause reactions of high-melting-point metal film 11 with silicon in $N^+$-source region 4, silicon in gate electrode 6 and silicon in $N^+$-drain region 4 to form metal silicide layers 9c, 9b and 9a in a self-aligned manner, respectively.

Thereafter, high-melting-point metal film 11, which remains without causing a reaction with silicon, is removed by wet etching so that the semiconductor device having the transistor shown in FIG. 1 is formed. Thereafter, the interlayer insulating film covering the transistor thus formed is formed so that the major portion of the semiconductor device is completed.

In the semiconductor device described above, a distance on the surface of silicon substrate 1 from a position immediately under the side surface of gate electrode 6 near $N^+$-drain region 2 to $N^+$-drain region 2 is longer than a length from a position immediately under the side surface of gate electrode 6 near $N^+$-source region to $N^+$-source region 4. Thus, the length of $N^-$-extension region 3a on the surface of silicon substrate 1 is longer than that of $N^-$-extension region 3b, and $N^-$-extension regions 3a and 3b are arranged asymmetrically with respect to gate electrode 6.

In the semiconductor device described above, sidewall insulating film 8 is formed on the side surface of the gate electrode, and silicon oxide film 7 covering at least $N^-$-extension region 3a is formed so that silicidation of these portions can be prevented when forming the metal silicide layer in a self-aligned manner. Thereby, metal silicide layers 9a, 9c and 9b, which are formed at the surfaces of $N^+$-drain region 2, $N^+$-source region 4 and gate electrode 6, respectively, can be prevented from being electrically connected to each other.

Since metal silicide layers 9a, 9c and 9b can lower the resistances of $N^+$-drain region 2, $N^+$-source region 4 and gate electrode 6, respectively, it is possible to improve the high-frequency characteristics of the semiconductor device used in the frequency bands already described.

In particular, silicon oxide film 7 covering $N^-$-extension region 3a prevents such a situation that the impurities in $N^-$-extension region 3a are taken into the metal silicide layer to lower its impurity concentration in the siliciding operation. Therefore, the drain breakdown voltage of the transistor does not lower.

When forming silicon oxide film 7, silicon oxide film 7 shown in FIG. 7 may shift laterally along the sheet of FIG. 7 if the overlaying precision of the mask in photolithography is insufficient.

If the amount of shift of silicon oxide film 7 depending on the overlaying precision of the mask is smaller than the width of the gate electrode, it is desired to form silicon oxide film 7 in such a fashion that the left end of silicon oxide film 7 is located substantially at or around the center of gate electrode 6. Thereby, gate electrode 6 can reliably have a portion not covered with silicon oxide film 7, and silicidation of this portion can be reliably performed.

Figure 9:
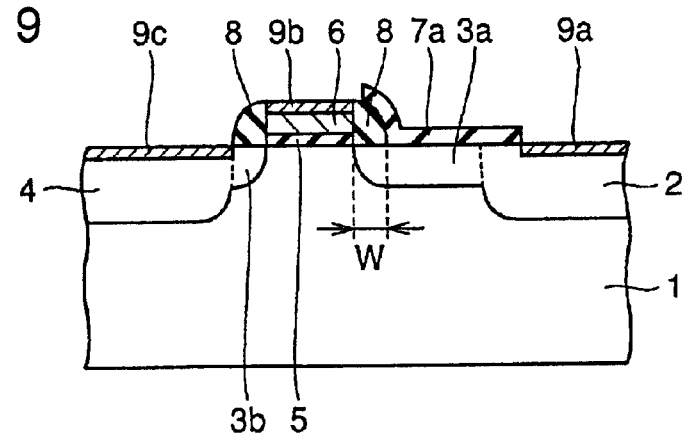
FIG. 9 is a cross section showing a step in a modification of the semiconductor device manufacturing method of the first embodiment.

As shown in FIG. 9, if the shift amount of silicon oxide film 7 depending on the overlaying precision of the mask is smaller than a width W of sidewall insulating film 8, silicon oxide film 7 may be formed to locate the left end of silicon oxide film 7 on the surface of sidewall insulating film 8.

In this case, since silicon oxide film 7 does not cover any portion of the top surface of gate electrode 6, metal silicide film 9b can be formed entirely over the top surface of gate electrode 6. As a result, the resistance of gate electrode can be further lowered, which contributes to improvement of the high-frequency characteristics.

Since silicon oxide film 7 has etching characteristics different from those of sidewall insulating film 8, silicon oxide film 7 can be formed substantially without effecting etching on sidewall insulating film 8. Thus, only silicon oxide film 7 can be removed substantially without effecting the etching on sidewall insulating film 8.

If a silicon oxide film is used as sidewall insulating film 8, it is preferable to use a silicon nitride film instead of silicon oxide film 7.

Second Embodiment

Description will now be given on a method of manufacturing a semiconductor device according to a second embodiment of the invention, and particularly another method of manufacturing a semiconductor device provided with a transistor, which includes $N^-$-extension regions arranged asymmetrically with respect to a gate electrode.

Figure 10:
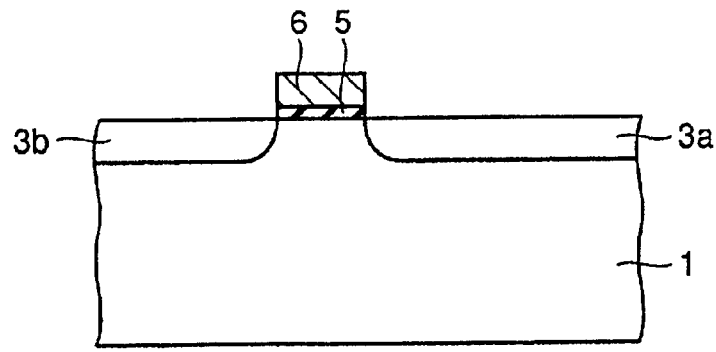
FIG. 10 is a cross section showing a step in a method of manufacturing a semiconductor device of a second embodiment.

First, a silicon oxide film, which will form a gate insulating film, is formed on silicon substrate 1. For example, a polycrystalline silicon film, which will form the gate electrode, is formed on the silicon oxide film thus formed. Predetermined photolithography and processing are effected on the polycrystalline silicon film to form gate electrode 6 on silicon substrate 1 with gate insulating film 5 therebetween, as shown in FIG. 10. Then, using gate electrode 6 as a mask, arsenic or the like is implanted into silicon substrate 1 to form extension regions 3a and 3b at impurity concentrations of about $1\times10^{16}$–$1\times10^{17}$/cm$^3$.

Figure 11:
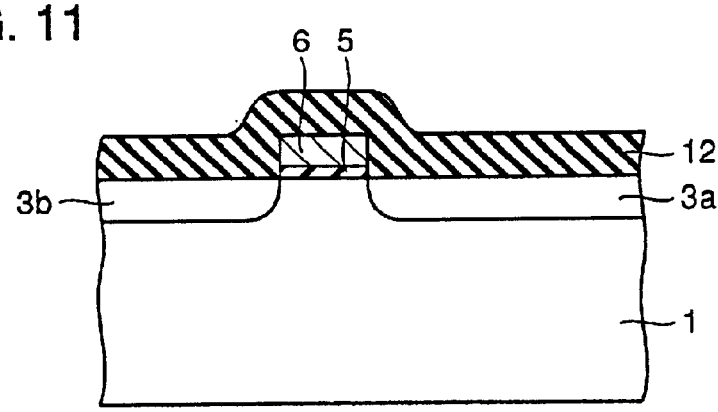
FIG. 11 is a cross section showing a step following the step shown in FIG. 10 in the second embodiment.
Figure 12:
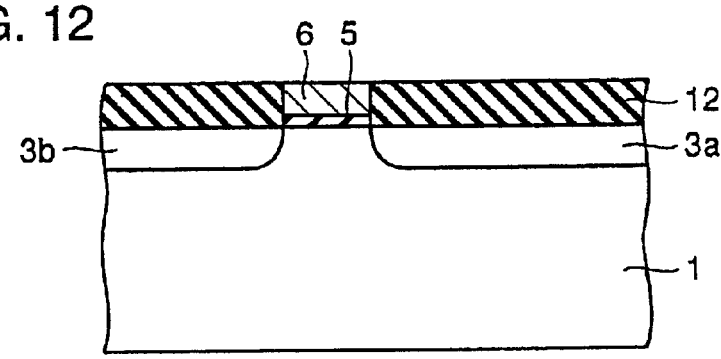
FIG. 12 is a cross section showing a step following the step shown in FIG. 11 in the second embodiment.

Then, as shown in FIG. 11, silicon oxide film 12 or the like covering gate electrode 6 is formed on silicon substrate 1. Then, as shown in FIG. 12, CMP (Chemical Mechanical Polishing) is effected on silicon oxide film 12 to flatten the surface of silicon oxide film 12 and expose the surface of gate electrode 6. Thus, silicon oxide film 12 has the top surface flush with the top surface of gate electrode 6.

Figure 13:
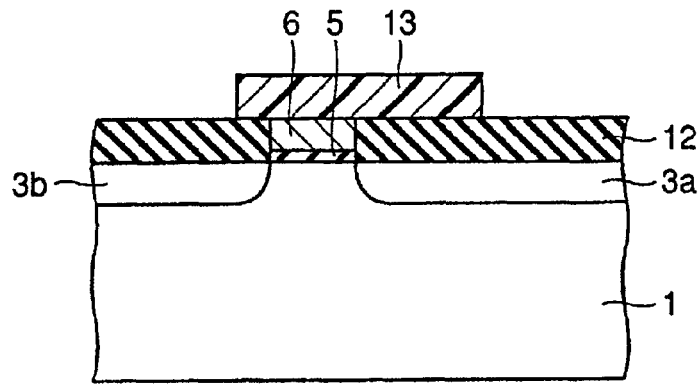
FIG. 13 is a cross section showing a step following the step shown in FIG. 12 in the second embodiment.
Figure 14:
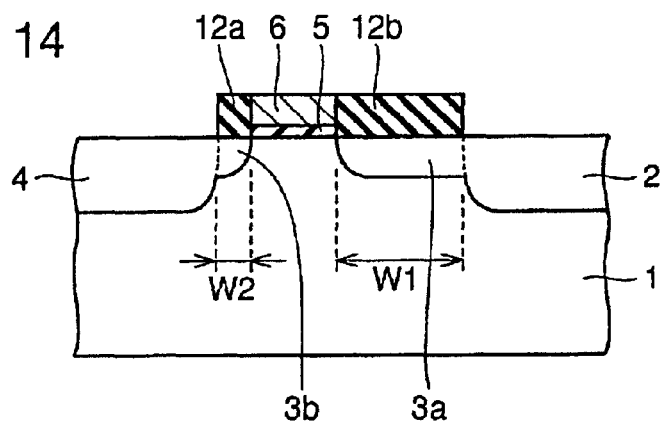
FIG. 14 is a cross section showing a step following the step shown in FIG. 13 in the second embodiment.

Then, as shown in FIG. 13, a resist pattern 13 is formed to establish a predetermined relationship with respect to gate electrode 6. Using resist pattern 13 as a mask, anisotropic etching is effected on silicon oxide film 12. Thereby, covering films 12a and 12b are formed in contact with the side surfaces of gate electrode 6, respectively, as shown in FIG. 14. Covering films 12a and 12b have different widths W1 and W2, and cover N$^-$-extension regions 3a and 3b, respectively.

Then, arsenic or the like is implanted into silicon substrate 1 masked with gate electrode 6 and covering films 12a and 12b so that N$^+$-drain region 2 and N$^+$-source region 4 are formed at impurity concentrations of $1\times10^{18}$–$1\times10^{19}$/cm$^3$.

Figure 15:
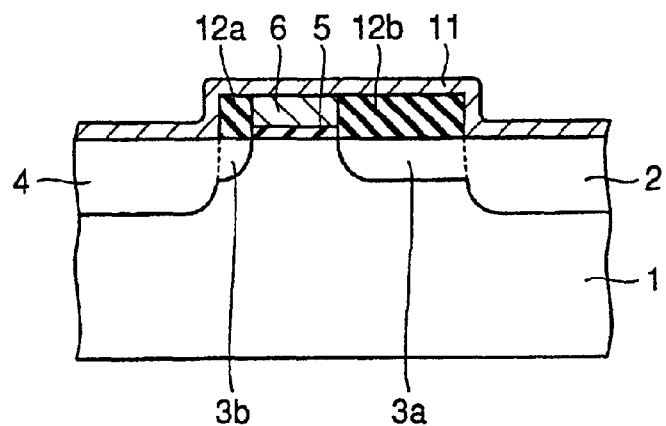
FIG. 15 is a cross section showing a step following the step shown in FIG. 14 in the second embodiment.

Then, as shown in FIG. 15, high-melting-point metal film 11 of, e.g., tungsten or cobalt is formed by the sputtering or the like over gate electrode 6 and covering films 12a and 12b. Then, heat treatment is effected at a temperature of about 400° C. to cause reactions of high-melting-point metal film 11 with silicon in N$^+$-source region 4, silicon in gate electrode 6 and silicon in N$^+$-drain region 2 so that metal silicide layers 9c, 9b and 9a are formed in a self-aligned manner, respectively.

Figure 16:
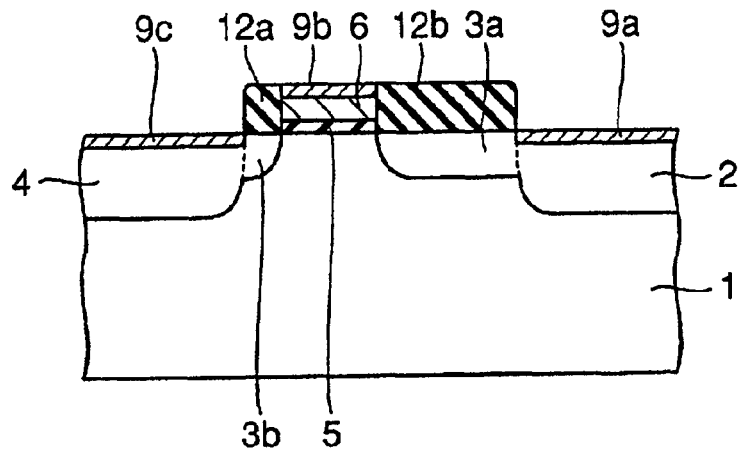
FIG. 16 is a cross section showing a step following the step shown in FIG. 15 in the second embodiment.
Figure 17:
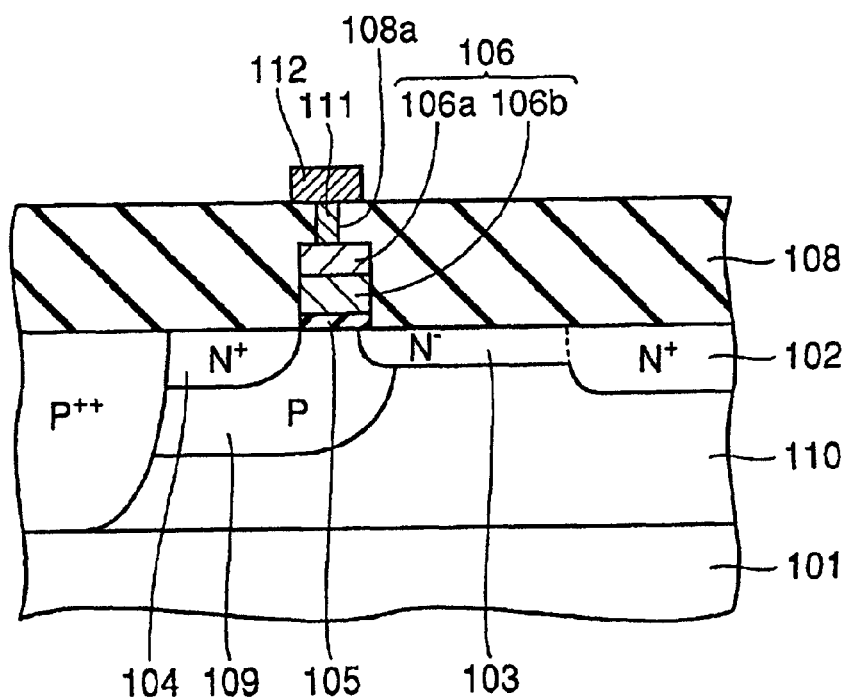
FIG. 17 is a cross section of a semiconductor device in the prior art.
Figure 18:
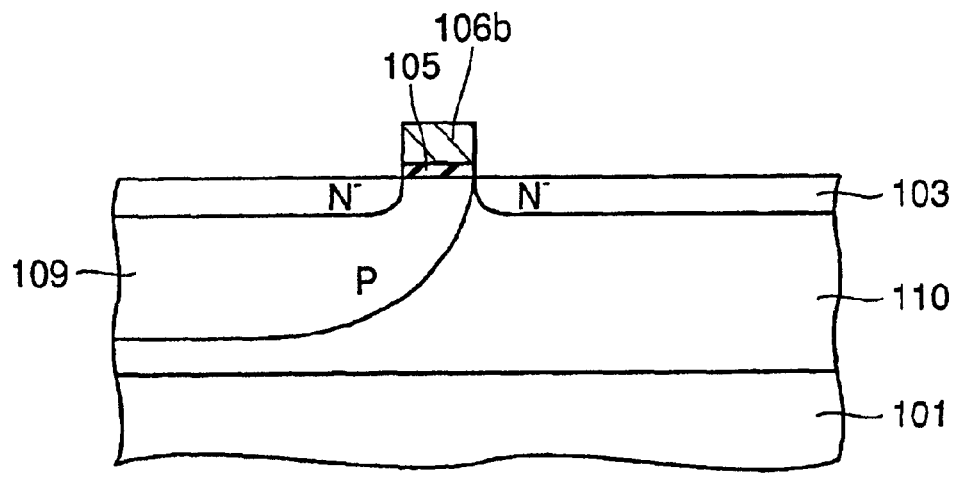
FIG. 18 is a cross section showing a step in a method of manufacturing the semiconductor device shown in FIG. 17.
Figure 19:
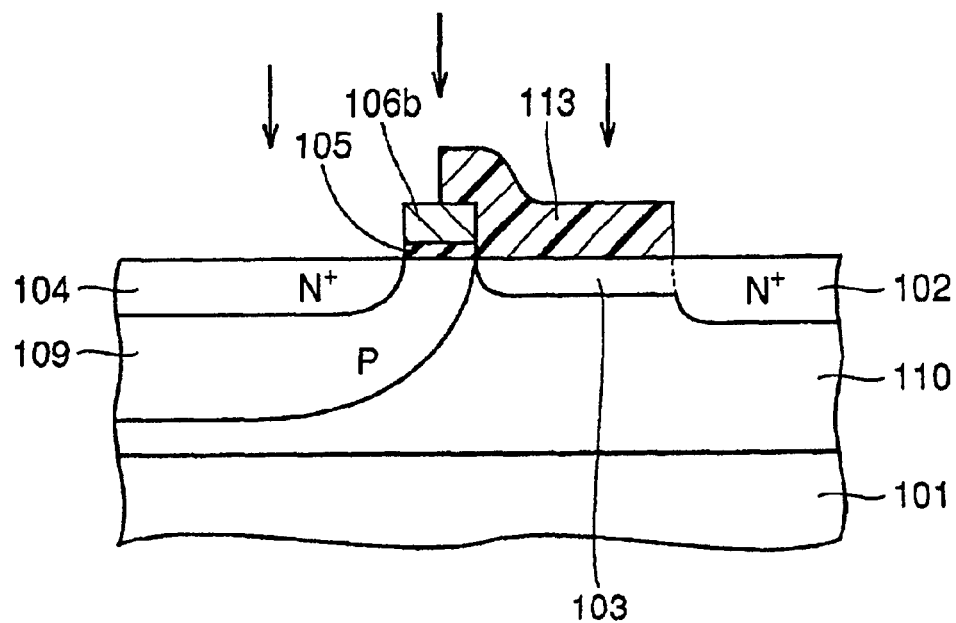
FIG. 19 is a cross section showing a step subsequent to the steps shown in FIG. 18.

Thereafter, high-melting-point metal film 11, which remains without causing a reaction with silicon, is removed by wet etching so that the semiconductor device having the transistor shown in FIG. 16 is formed. Thereafter, the interlayer insulating film covering the transistor thus formed is formed so that the major portion of the semiconductor device is completed.

According to the method of manufacturing the semiconductor device described above, as shown in FIG. 14, covering films 12a and 12b having different widths are formed in contact with the side surfaces of gate electrode 6, respectively, so that regions forming N$^-$-extension regions 3a and 3b are covered with covering films 12a and 12b, respectively.

Thereby, it is possible to prevent silicidation of N$^-$-extension regions 3a and 3b when forming the metal silicide layers in a self-aligned manner. Thereby, metal silicide layers 9a, 9c and 9b, which are formed at the surfaces of N$^+$-drain region 2, N$^+$-source region 4 and gate electrode 6, respectively, can be prevented from being electrically connected to each other.

In this case, metal silicide layer 9b, which is formed entirely over the top surface of gate electrode 6, can lower the resistance of gate electrode 6.

Since metal silicide layers 9a and 9c can lower the resistances of N$^+$-drain region 2 and N$^+$-source region 4, respectively, it is possible to improve the high-frequency characteristics of the semiconductor device used in the above frequency bands.

Covering films 12a and 12b covering N$^-$-extension regions 3a and 3b prevent such a situation that the impurities in N$^-$-extension region 3a are taken into the metal silicide layer to lower its impurity concentration in the siliciding operation. Therefore, the drain breakdown voltage of the transistor does not lower.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a semiconductor substrate having a main surface;
   an insulating film on said semiconductor substrate and an electrode on said insulating film and having opposite first and second side surfaces and a top surface;
   a first impurity region of a first conductivity type in said semiconductor substrate and at the main surface of said semiconductor substrate, extending substantially from a position immediately under the first side surface of said electrode, away from said electrode, and having a first length on the main surface of said semiconductor substrate;
   a second impurity region of the first conductivity type in said semiconductor substrate at the main surface of said semiconductor substrate, extending substantially from a position immediately under the second side surface of said electrode, away from said electrode, and having a second length on the main surface of said semiconductor substrate shorter than the first length;
   a third impurity region of the first conductivity type in said semiconductor substrate and at the main surface of said semiconductor substrate, extending, from a position neighboring said first impurity region, away from said electrode, and having a higher impurity concentration than said first impurity region;
   a fourth impurity region of the first conductivity type in said semiconductor substrate and at the main surface of said semiconductor substrate, extending, from a position neighboring said second impurity region, away from said electrode and having a higher impurity concentration than said second impurity region; and
   a metal silicide layer on at least a portion of the top surface of said electrode and surfaces of said third and fourth impurity regions.

2. The semiconductor device according to claim 1, further comprising a protection film covering a portion of the top surface of said electrode and surfaces of said first and second impurity regions for preventing silicidation of the portion of the top surface of said electrode and the surfaces of said first and second impurity regions.

3. The semiconductor device according to claim 2, wherein, said protection film includes:
   a first sidewall insulating film on the first side surface of said electrode, and covering a portion of the surface of said first impurity region,
   a covering film continuously covering at least a portion of a surface of said first sidewall insulating film and the part of the surface of said first impurity region not covered with said first sidewall insulating film, and
   a second sidewall insulating film on the second side surface of said electrode and covering all of the surface of said second impurity region.

4. The semiconductor device according to claim 3, wherein said covering film has etching characteristics different from etching characteristics of said first and second sidewall insulating films.

5. The semiconductor device according to claim 1, wherein said metal silicide layer covers all of the top surface of said electrode.

6. The semiconductor device according to claim 5, further comprising a protection film covering surfaces of said first and second impurity regions for preventing silicidation of the surfaces of said first and second impurity regions.

7. The semiconductor device according to claim 6, wherein said protection film includes:

a first covering film in contact with the first side surface of said electrode, and covering all of the surface of said first impurity region, and a second covering film in contact with the second side surface of said electrode, and covering all of the surface of said second impurity region.

* * * * *